United States Patent [19]

Keaton

[11] Patent Number: 5,133,256

[45] Date of Patent: Jul. 28, 1992

[54] PRINTER PLATE LOCATING DEVICE

[75] Inventor: William R. Keaton, Owatonna, Minn.

[73] Assignee: AG Communication Systems Corporation, Phoenix, Ariz.

[21] Appl. No.: 666,965

[22] Filed: Mar. 11, 1991

[51] Int. Cl.⁵ .............................................. B41F 15/14
[52] U.S. Cl. ........................... 101/481; 101/DIG. 36; 101/115; 101/126; 414/781; 33/614; 206/334
[58] Field of Search ............... 101/DIG. 35, 481, 114, 101/115, 123, 124, 126, 129, 35; 33/614, 615, 616, 617, 618, 619, 620, 621, 622; 29/559, 760; 206/328, 334; 269/287, 288, 903; 414/780, 781, 782, 785, 749, 750; 118/720, 721, 504, 505

[56] References Cited

U.S. PATENT DOCUMENTS

| | | | |
|---|---|---|---|
| 3,206,126 | 9/1965 | Byron | 118/721 |
| 4,226,569 | 10/1980 | Gerard | 414/737 |
| 4,425,076 | 1/1984 | Colineau | 414/781 |
| 4,549,843 | 10/1985 | Jagusch | 414/416 |
| 4,573,406 | 3/1986 | Cleemput | 101/127.1 |
| 4,700,488 | 10/1987 | Curti | 33/613 |
| 4,767,984 | 8/1988 | Bakker | 324/158 F |
| 5,080,228 | 1/1992 | Maston III | 206/331 |

FOREIGN PATENT DOCUMENTS

| | | | |
|---|---|---|---|
| 55154 | 6/1982 | European Pat. Off. | 101/DIG. 36 |
| 191150 | 8/1987 | Japan | 101/129 |

Primary Examiner—Edgar S. Burr
Assistant Examiner—Eric P. Raciti
Attorney, Agent, or Firm—Anthony J. Baca

[57] ABSTRACT

A printer plate locating device used in the alignment of printer plates with respect to a screen or stencil holder of a screen printing machine. The present invention is particularly useful when used in a multi-station printing machine where the printing machine sequentially moves the printer plates into a printing station to affect the printing or image transfer. The present invention consists of two securely connected rigid plates and a system of actuators. The mounting plate 1 acts as a support or structural member for the rest of the apparatus. The alignment plate, being smaller in size than the mounting plate, provides edges against which the substrate locating devices of the printer plate make contact. In operation, the present invention is fastened to the screen holder in place of a screen or stencil on the first station of the machine. The actuators are positioned relative to the printer plate such that upon energizing, the actuators propel the printer plate into contact with the alignment plate of the apparatus. Additionally, access is provided to the lockdown devices of the printer plate to enable clamping or lockdown to the machine while the actuators are energized, thus maintaining position of the printer plate relative to the screen holder.

6 Claims, 3 Drawing Sheets

PRINTER PLATE LOCATING DEVICE

FIELD OF THE INVENTION

The present invention relates in general to the screen printing process and more particularly, to a printer plate locating device used in the alignment of printer plates with respect to a screen or stencil holder of a printing machine. The present invention is particularly useful when used in a multi-station printing machine where the printing machine sequentially moves the printer plates into a printing station to affect the printing or image transfer.

BACKGROUND OF THE INVENTION

Prior to the present invention, alignment of substrates of a multi-station printing machine was tedious and time consuming. Alignment was accomplished by manually rotating several minute threaded devices which changed the location of a printer plate relative to the holder. Simultaneously, a number of instruments indicating the relative positions of the holder and printer plate were observed.

This procedure was repeated for each of the printer plates of the printing machine. Further compounding the difficulty was the need to locate each of the printer plates to positions adequate to provide repeatable image generation on substrates within constraints of the product.

Among the disadvantages to this procedure were: A) Alignment of each printer plate to the same relative position of the first required thirty minutes; B) The instruments that indicate position can be located in an area which has limited accessibility, thus demanding endurance of substantial physical stress by the operator while performing this intricate adjustment; C) The position of each printer plate was sensitive to the rotating action of the lockdown screws during the lockdown process.

SUMMARY OF THE INVENTION

In order to accomplish the objective of the present invention there is provided a locating device for alignment of a printer plate with respect to a screen holder. The locating device includes a first rigid plate attached to the holder. The first rigid plate provides the structure and support. A second rigid plate, which is attached to the first rigid plate, and of a smaller surface area than the first rigid plate provides reference edges. A pair of actuators which are attached to the first rigid plate, move the printer plate laterally when activated. A set of locating pins on the printer plate come in contact with the edges of the second rigid plate, whereby the printer plate is aligned with respect to the screen holder. After locking the printer plate into position the actuators are deactivated, the screen holder is lifted up and the next printer plate is cycled into position for alignment.

DESCRIPTION OF THE DRAWINGS

A better understanding of the invention may be had from the consideration of the following detailed description taken in conjunction with the accompanying drawings, in which.

DESCRIPTION OF THE PREFERRED EMBODIMENT

Figure 1:
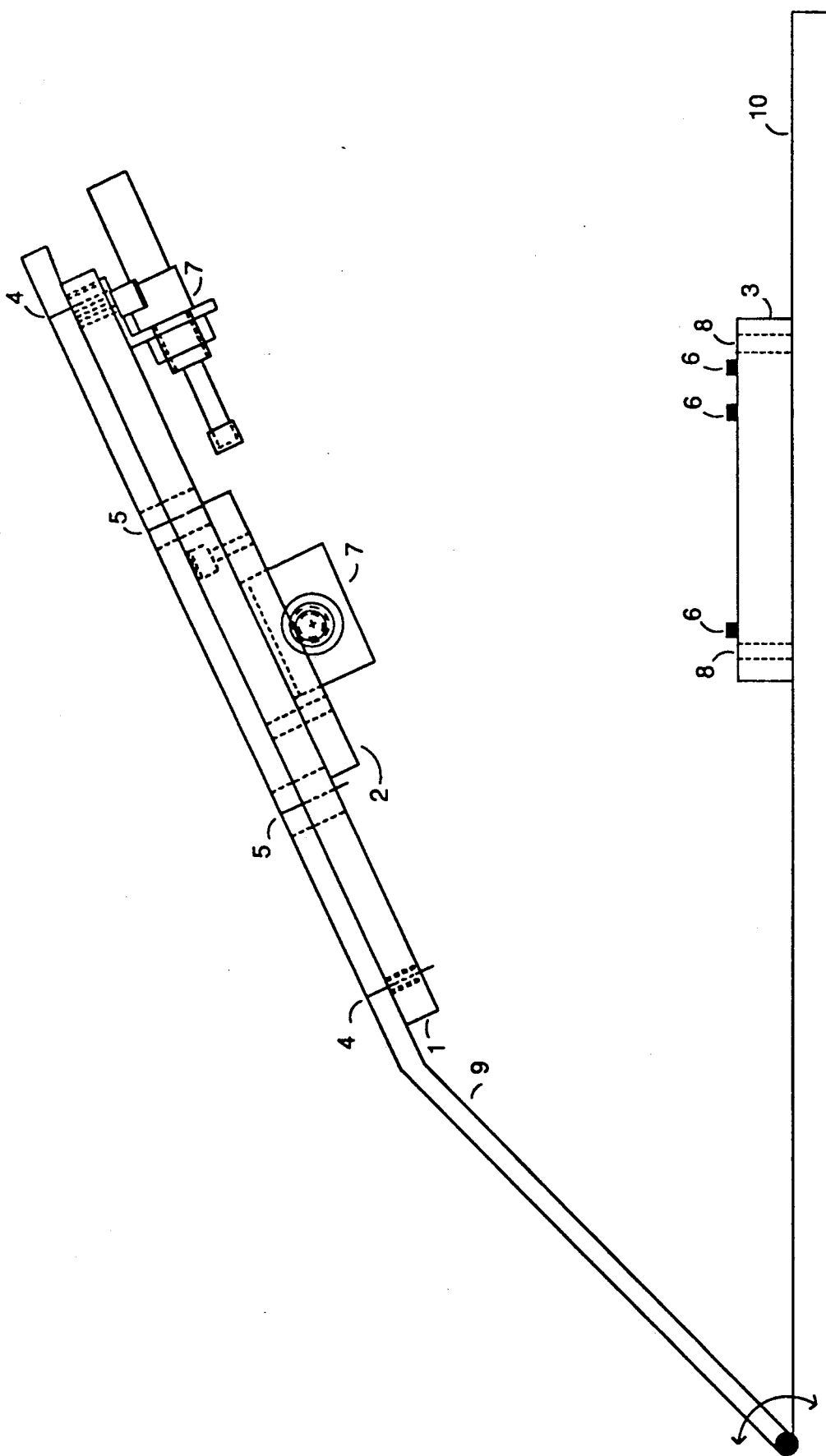
FIG. 1 shows the present invention installed on the printer.
Figure 2:
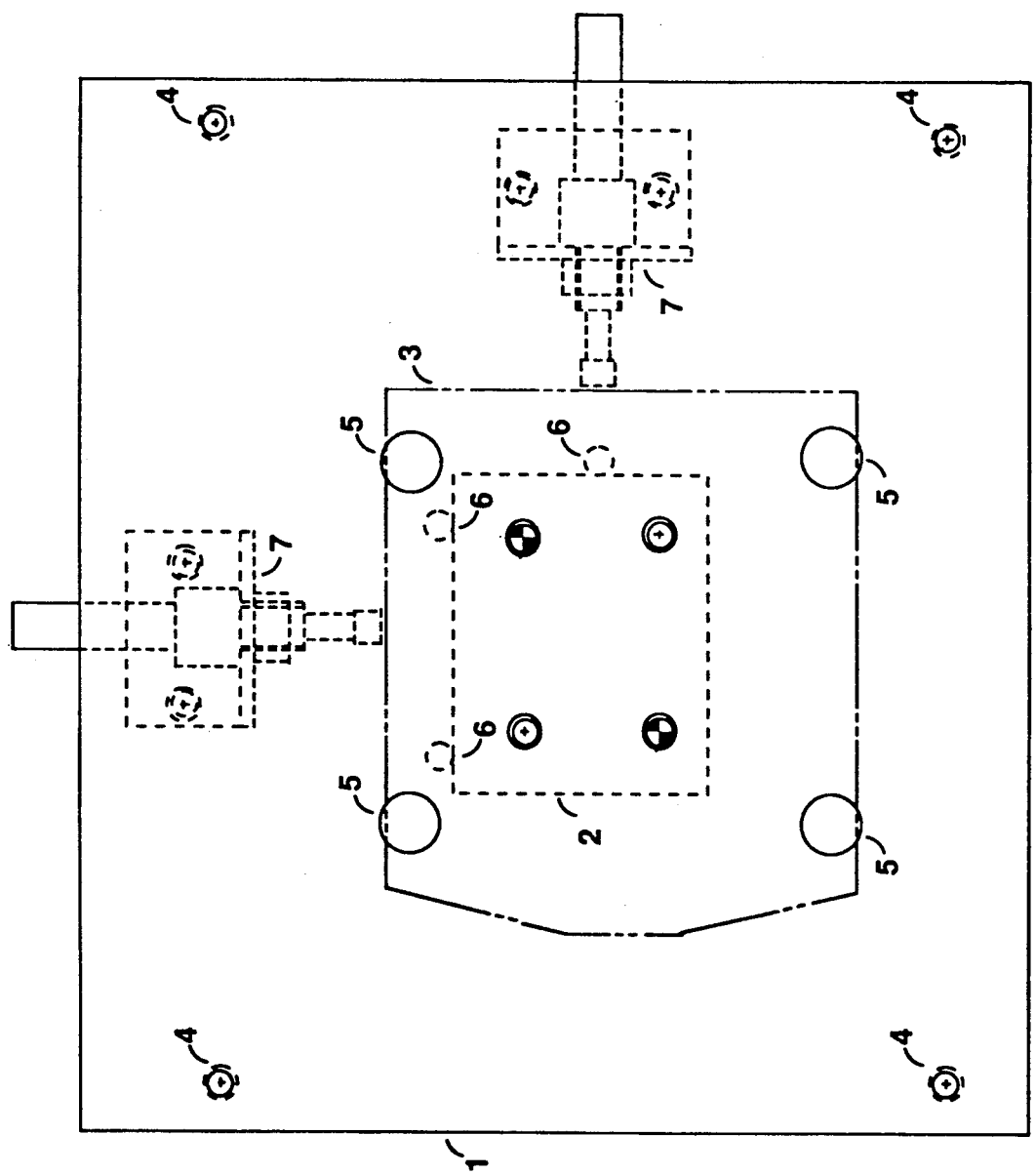
FIG. 2 is a top view assembly drawing of the printer plate locating device.
Figure 3:
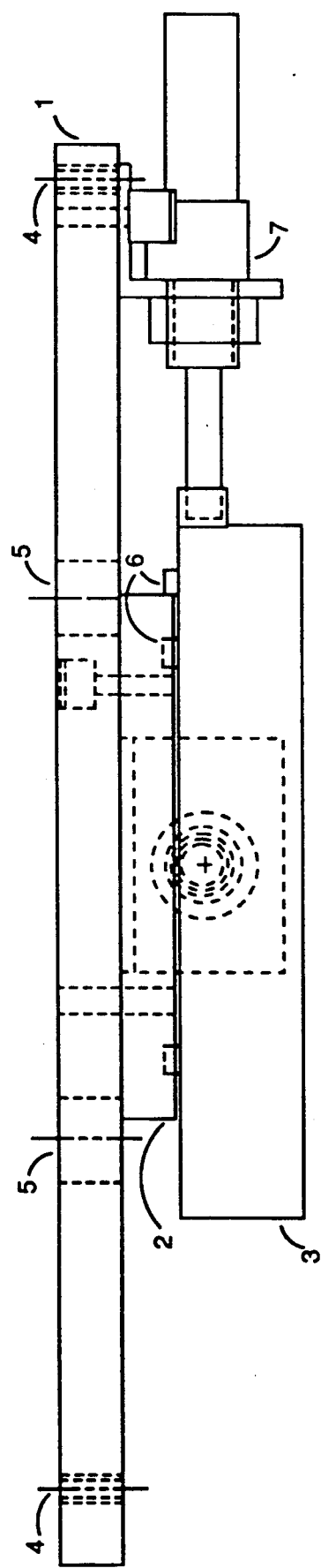
FIG. 3 is a side view assembly drawing of the printer plate locating device.

Referring to FIG. 1 where the present invention, as installed on the printer, is shown. FIGS. 2 and 3 also should be referenced. Note: the same reference numbers on FIGS. 1, 2 and 3 identify the same element; for example, reference number 5 on FIG. 1 identifies the same element as reference number 5 on FIGS. 2 and 3. Also note that actuators 7 are shown at ½ stroke length.

The present invention is utilized on an multi-station screen printer. The present invention may be used on multicolor screen printing machines, or on microcircuit fabrication machines to fabricate thick film hybrid electronic circuits. Each station has one printer plate associated with it. The printer plates 3 are used to transport substrates through the printing operation. As the machine cycle progresses, succeeding printer plates and their associated substrates are brought into the printing position of the machine. If there are variations in the position of the substrates relative to the screen, there will be consequent variations in the location of the printed image. When printer plates are removed from the machine, they must be replaced in positions adequate to ensure proper consistent image location.

The present invention consists of two securely connected printer plates (mounting plate 1 and alignment plate 2) and a system of actuators 7, where the actuators 7 are solenoids and may be air or electrically operated. Rigid plates 1 and 2 are structural members and are not printing plates or frames for a printing screen. The mounting plate 1 acts as a support or structural member for the rest of the apparatus. The alignment plate 2, being smaller in size than the mounting plate 1, provides edges against which the substrate locating devices 6 of the printer plate 3 make contact. In operation, the present invention is fastened in place of a screen or stencil on the first station of the machine. The actuators 7 are positioned relative to the plates (1 and 2) such that upon energizing, the actuators 7 propel the printer plate 3 into contact with the alignment plate 2 of the apparatus. Additionally, access is provided to the lockdown devices of the printer plate 3 to enable clamping or lockdown to the machine 10 while the actuators are energized, thus maintaining position of the printer plate 3 relative to the screen holder 9.

In use, the invention is attached to the pivoting screen holder 9 through holes 4. In operation, the present invention is fastened in place of a screen or stencil on the first station of the machine. Alignment plate 2 is rigidly attached to mounting plate 1, as are, actuators 7. Holes 5 extend through pivoting screen holder 9 and plates 1 and 2. Printer plate 3, which holds the substrate that is to be located, is placed on the machine 10 with lockdown screws 8 loose to allow movement of the printer plate. The pivoting screen holder 9 is lifted, and the first printer plate is cycled into the print station position. The screen holder 9 and plate locating device are gently lowered into position over the printer plate 3. Actuators 7 are energized, thereby moving printer plate 3 into a position whereby the substrate locating pins 6 are in contact with the locating edges of alignment plate 2. While the actuators 7 are energized, a tool, through holes 5, is engaged with the lockdown screws 8 and printer plate 3 is secured in position. The actuators 7 are deenergized, the holder raised, and the next printer plate is cycled into position, and the cycle repeats for each plate.

The printer plate locating device is an improvement over prior art because each printer plate can be aligned in five minutes, and simultaneous manipulation of adjustment tools and observation of position indicators is not required. Additionally, increased operator comfort is provided due to improved stance, and the plate does not shift during lockdown. Finally, location will be improved because the printer plates are positioned relative to the screen holder itself, rather than a measuring device. Thus, an accumulation of tolerances in the measuring device and its holder is avoided.

These improvements are due to several characteristics, including maintenance of desired position during lockdown, access to lockdown mechanism through the locating device, and elimination of the position indicators.

This concept can be employed in any machinery that requires accurate positioning between one head and a multitude of stations, or vice versa. Furthermore, on machines with more than one head and more than one station, the heads can be aligned to each other, then the stations aligned to the heads. In this circumstance, a station would be aligned to head "A", clamped into position, and cycled to head "B". The position discrepancy between head "B" and the station could be measured, corrected, and the balance of the stations would be moved to the same relative position as the first.

Although the preferred embodiment of the invention has been illustrated, and that form described, it will be readily apparent to those skilled in the art that various modifications may be made therein without departing from the spirit of the invention or from the scope of the appended claims.

What is claimed is:

1. A locating device for alignment of a printer plate with respect to a holder, said locating device comprising:
    a rigid alignment plate attached to said holder;
    a plurality of locating pins attached to said printer plate; and
    first and second actuator means attached to said holder, said first and second actuator means being mounted so that their actuation movements are perpendicular to each other and operated to move said printer plate until said plurality of locating pins are in contact with said rigid alignment plate, whereby said printer plate is aligned with respect to said holder.

2. A locating device as claimed in claim 1 wherein said first and second actuator means include a first and second air cylinder solenoid respectively.

3. A locating device for alignment of a printer plate with respect to a holder, said locating device comprising:
    a rigid mounting plate attached to said holder;
    a rigid alignment plate attached to said rigid mounting plate, said rigid alignment plate being of a smaller surface area than said rigid mounting plate;
    a plurality of locating pins attached to said printer plate; and
    first and second actuator means attached to said rigid mounting plate, said first and second actuator means being mounted so that their actuation movements are perpendicular to each other and operated to move said printer plate until said plurality of locating pins are in contact with said rigid alignment plate, whereby said printer plate is aligned with respect to said holder.

4. A locating device as claimed in 3 wherein said first and second actuator means including a first and second air cylinder solenoid.

5. A locating device as claimed in claim 1 wherein said first and second actuator means include a first and second electrically-operated solenoid, respectively.

6. A locating device as claimed in claim 3 wherein said first and second actuator means include a first and second electrically-operated solenoid, respectively.

* * * * *